United States Patent
Cohen et al.

[11] Patent Number: 5,907,297
[45] Date of Patent: May 25, 1999

[54] BITMAP INDEX COMPRESSION

[75] Inventors: Jeffrey I. Cohen, Sunnyvale; Michael Depledge, San Jose; Hakan Jakobsson, San Francisco; Cetin Ozbutun, San Carlos, all of Calif.

[73] Assignee: Oracle Corporation, Redwood Shores, Calif.

[21] Appl. No.: 08/808,560

[22] Filed: Feb. 28, 1997

[51] Int. Cl.⁶ ..................................... H03M 7/30
[52] U.S. Cl. ............................... 341/95; 341/50
[58] Field of Search ........................ 341/50, 95

[56] References Cited

U.S. PATENT DOCUMENTS 5,363,098   11/1994   Antoshenkov ........................ 341/95

OTHER PUBLICATIONS

Oracle Press Releases, "Oracle 7 Release 7.3 extends Oracle's lead in Data warehousing Market", http://www.oracle.com/corporate/press/html/73w.html,; Oracle to host first developer conference; Preview new products, Jan. 30, 1996, http://www.oracle.com/corporate/press/html/odc2.html DBMS vol. 8, No. 13, p. 112 IOUW wrap–up.

Rennhackkamp, Martin DBMS, vol. 9, No. 12, pS12(3) Nov. 1996, DBMS Server Comparison Supplement Software Review Evaluation Oracle, Oracle7 7.3 and Universal Server.

*Primary Examiner*—Howard L. Williams
*Attorney, Agent, or Firm*—McDermott, Will & Emery

[57] ABSTRACT

A method and apparatus for compressing data is provided. The invention compresses an input bit stream into a compressed output bit stream. The input bit streams are byte aligned and classified. Bytes with all bits set to value zero are classified as gap bytes. Bytes with only one bit set to value one are classified as offset bytes. All other bytes are classified as map bytes. Groups of adjacent bytes are organized into two types of groups. The first type is a gap bit group. A gap map group contains gap bytes and one offset byte. The second type is the gap map group. It contains gap bytes and map bytes. The number of gap bytes in a group is called a gap size. The groups are compressed into four types of atoms. Each type of atom has one control byte, zero or more gap size bytes, and zero or map bytes. A control byte describes the atom. The map bytes in an atom are copies of the map bytes in the control group.

18 Claims, 9 Drawing Sheets

Fig. 9

Table 900

| Group Type | Atom Type | TFIELD value | GBYTES | OBYTES | MBYTES | GAP SIZE BYTES |
|---|---|---|---|---|---|---|
| Gap Bit | Short gap bit | 0-23 | 0-23 | 1 | x | 1- |
| | Long gap bit | 24 | 24- | 1 | x | 1- |
| Gap Map | Short gap map | 25-30 | 0-5 | x | 1-8 | 1- |
| | Long gap map | 31 | 6- | x | 1-8 | 1- |

BITMAP INDEX COMPRESSION

RELATED APPLICATIONS

The present application is related to: U.S. patent application Ser. No. 08/807,344, entitled "CREATING BITMAPS FROM MULTI-LEVEL IDENTIFIERS", filed by Cetin Ozbutun, Michael Depledge, Hakan Jakobsson, Mark Kremer, Jeffrey I. Cohen, Quoc Tai Tran, and Alexander C. Ho on Feb. 28, 1997 the contents of which are incorporated herein by reference.

U.S. patent application Ser. No. 08/808,584, entitled "BITMAP SEGMENTATION", filed by Cetin Ozbutun, Jeffrey I. Cohen, Hakan Jakobsson, Mark Kremer, Michael Depledge, Quoc Tai Tran, Alexander C. Ho, and Julian Hyde, on Feb. 28, 1997 the contents of which are incorporated herein by reference.

U.S. patent application Ser. No. 08/752,128, entitled "METHOD AND APPARATUS FOR PROCESSING COUNT STATEMENTS IN A DATABASE SYSTEM", filed by Cetin Ozbutun, Michael Depledge, Hakan Jakobsson, and Jeffrey I. Cohen, on Nov. 20, 1996, the contents of which are incorporated herein by reference.

U.S. patent application Ser. No. 08/808,097, entitled "GROUP BY AND DISTINCT SORT ELIMINATION USING COST-BASED OPTIMIZATION", filed by Jeffrey Ira Cohen, Cetin Ozbutun, Michael Depledge, and Hakan Jakobsson, on Feb. 28, 1997 the contents of which are incorporated herein by reference.

U.S. patent application Ser. No. 08/808,096, entitled "METHOD AND APPARATUS FOR USING INCOMPATIBLE TYPES OF INDEXES TO PROCESS A SINGLE QUERY", filed by Jeffrey Ira Cohen, Cetin Ozbutun, Hakan Jakobsson, and Michael Depledge, on Feb. 28, 1997 the contents of which are incorporated herein by reference.

U.S. patent application Ser. No. 08/808,094, entitled "INDEX SELECTION FOR AN INDEX ACCESS PATH", filed by Hakan Jakobsson, Michael Depledge, Cetin Ozbutun, and Jeffrey I. Cohen, on Feb. 28, 1997 the contents of which are incorporated herein by reference.

U.S. patent application Ser. No. 08/807,429, entitled "QUERY PROCESSING USING COMPRESSED BITMAPS", filed by Cetin Ozbutun, Jeffry I. Cohen, Michael Depledge, Julian Hyde, Hakan Jakobsson, Mark Kremer, and Quoc Tai Tran, on Feb. 28, 1997 the contents of which are incorporated herein by reference.

U.S. patent application Ser. No. 08/807,451, entitled "BITMAPPED INDEXING WITH HIGH GRANULARITY LOCKING", filed by Michael Depledge, Jeffrey I. Cohen, Hakan Jakobsson, Mark Kremer, Cetin Ozbutun, Quoc Tai Tran, and Alexander C. Ho, on Feb. 28, 1997 the contents of which are incorporated herein by reference.

U.S. patent application Ser. No. 08/808,585, entitled "UPDATING BITMAPPED INDEXES", filed by Michael Depledge, Hakan Jakobsson, Cetin Ozbutun, Jeffrey I. Cohen, and Quoc Tai Tran, on Feb. 28, 1997 the contents of which are incorporated herein by reference.

U.S. patent application Ser. No. 08/808,586, entitled "COMBINING BITMAPS WITHIN A MEMORY LIMIT", filed by Cetin Ozbutun, Jeffry I. Cohen, Michael Depledge, Julian Hyde, Hakan Jakobsson, Mark Kremer, and Quoc Tai Tran, on Feb. 28, 1997 the contents of which are incorporated herein by reference.

FIELD OF THE INVENTION

The present invention relates to a method of compressing data in computer systems, and more particularly, to the compression of bitmaps within bitmap indexes used to access data stored in databases.

BACKGROUND OF THE INVENTION

A bitmap index is an index that includes a set of bitmaps that can be used to efficiently process queries on a body of data associated with the bitmap index. In the context of bitmap indexes, a bitmap is a series of bits that indicate which of the records stored in the body of data satisfy a particular criteria. Each record in the body of data has a corresponding bit in the bitmap. Each bit in the bitmap serves as a flag to indicate whether the record that corresponds to the bit satisfies the criteria associated with the bitmap.

Typically, the criteria associated with a bitmap is whether the corresponding records contain a particular key value. In the bitmap for a given key value, all records that contain the key value have their corresponding bits set to 1 while all other bits are set to 0. A collection of bitmaps for the key values that occur in the data records can be used to index the data records. In order to retrieve the data records with a given key value, the bitmap for that key value is retrieved from the index, and for each bit set to 1 in the bitmap, the corresponding data record is retrieved. The records that correspond to bits are located based on a mapping function between bit positions and data records.

Since bitmaps are in the form of binary numbers, they can be combined in logical operations, such as AND operations, very efficiently in a digital computer. However, bitmaps waste space when a large portion of each bitmap is used to store nothing but logical zeros. For example, assume that a table contains a million rows, where a particular column of the table has 500,000 distinct values. A bitmap index on that column would have 500,000 index entries storing bitmaps which, on average, have two bits set to "1" and 999,998 bits set to "0".

To further enhance the efficiency of bitmaps, especially those with large sequences of logical zeros, compression is used. There are many compression techniques. However, none of the known compression techniques is designed specifically for the distribution of bits found in the bitmaps of bitmap indexes found in large databases.

One example of a compression method is described in U.S. Pat. No. 5,363,098 entitled "Byte Aligned Data Compression," issued to Gennady Antoshenkov on Nov. 8, 1994. In general terms, the '098 method divides bytes into two classes. The first class is Gap bytes (GBYTES), which are bytes with all the bits set to the same value, either logical one or logical zero. The second class is Map bytes (MBYTE), which are bytes where all the bits are not set to the same value. Finally, the number of bytes in a sequence of consecutive GBYTES is called the gap size.

The '098 method represents groups of consecutive MBYTES or groups of consecutive GBYTES (followed optionally by MBYTES) as encoded atoms of bytes. The first byte is referred to as the control byte. The control byte (CBYTE) describes the bytes that are in the atom. In atoms that represent MBYTES, the MBYTES themselves follow the CBYTE at some point. In atoms that represent GBYTES, bytes may or may not follow the CBYTE.

The CBYTE is divided into three fields of adjacent bits, which are the TFIELD, FFIELD, and the DFIELD. The use of the fields depends on whether MBYTES or GBYTES are being encoded in the atom. The TFIELD is a three bit field denoting the type of atom, including special case atoms. The FFIELD is used to denote the value of the bits in GBYTES, or in other words, whether all the bits are set to one or zero. The DFIELD is either a three or four bit field denoting the number of MBYTES in the atom.

In atoms encoding GBYTES, the gap size is used to indicate how many GBYTES are represented by the atom. Gap size is an integer number. For the smaller gap sizes, the gap size is represented by the TFIELD. When this field ranges in value from 0 to 3, it represents a gap size of 1 to 4 bytes respectively. For gap sizes greater than 1 to 4, gap size is stored in a series of bytes which immediately follow the CBYTE. Larger series are needed for larger gap sizes. The first byte in a series uses a field of adjacent bits to represent the number of bytes in the series. The rest of the bits in the first byte and in the following bytes can be used to specify the gap size.

The '098 method is less than optimal for representing the GBYTES of bitmap indexes in databases. In typical bitmap indexes, almost all the GBYTES have bits of zero value. Thus, using the FFIELD to denote the value can be wasteful because most GBYTES have bits of zero value anyway. Further, in bitmap indexes found in databases, the gap size is skewed towards the smaller numbers. The '098 method waste bits that could be used to represent smaller numbers for gap sizes. The FFIELD bit is wasted by using the bit to denote the value of the bits in GBYTES rather than using it as an additional bit to represent a number. In cases where a series of bytes following the CBYTE is used to represent the gap size, some of the bits of the first byte in the series are wasted by using them to represent the number in the series rather than gap sizes.

Based on the foregoing, it is clearly desirable to provide a mechanism that is better adapted from compressing the bit distribution found in the bitmaps within the bitmap indexes of databases. It is further desirable to provide a mechanism that is better adapted for compressing data composed of small-sized gaps of zero value GBYTES.

SUMMARY OF THE INVENTION

The invention compresses an input bit stream into a compressed output bit stream. The input bit streams are byte aligned and classified. Bytes with all bits set to value zero are classified as gap bytes. Bytes with only one bit set to value one are classified as offset bytes. All other bytes are classified as map bytes.

Groups of adjacent bytes are organized into two types of groups. The first type is a gap bit group. A gap bit group contains gap bytes and one offset byte. The second type is the gap map group. It contains gap bytes and map bytes. The number of gap bytes in a group is called a gap size.

The groups are compressed into four types of atoms. Each type of atom has one control byte, zero or more gap size bytes, and zero or map bytes. A control byte describes the atom. The map bytes in an atom are copies of the map bytes in the group.

A control byte is composed of two fields. The DFIELD is composed of a three bit sequence and the TFIELD is composed of a five bit sequence. The DFIELD and TFIELD are composed of the same sequence of bits in all types of atoms, and each field contains a value. The range in which the value in the TFIELD falls indicates the type of atom. The TFIELD also represents the gap size of the atom. The DFIELD is used to either indicate which bit in an offset byte is set to value one, or to indicate the number of map bytes in the atom.

BRIEF DESCRIPTION OF THE DRAWINGS

The present invention is illustrated by way of example, and not by way of limitation, in the figures of the accompanying drawings and in which like reference numerals refer to similar elements and in which:

FIG. 9 shows a summary of the structure of atoms.

DETAILED DESCRIPTION OF THE PREFERRED EMBODIMENT

A method and apparatus for compressing data is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Hardware Overview

Figure 1:
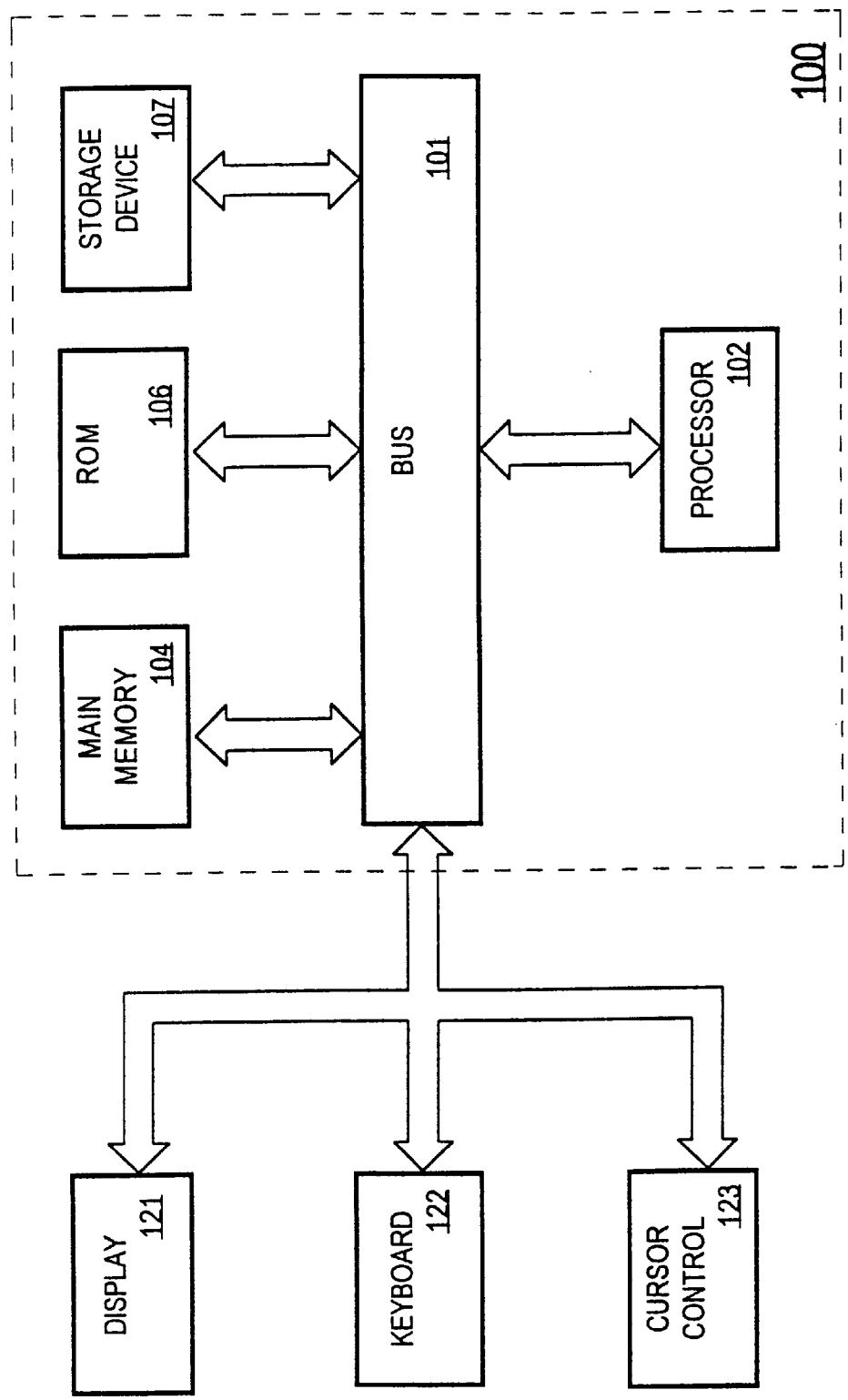
FIG. 1 is a block diagram of a computer system that may be used to implement an embodiment of the invention.

Referring to FIG. 1, it is a block diagram of a computer system 100 upon which an embodiment of the present invention can be implemented. Computer system 100 includes a bus 101 or other communication mechanism for communicating information, and a processor 102 coupled with bus 101 for processing information. Computer system 100 further comprises a random access memory (RAM) or other dynamic storage device 104 (referred to as main memory), coupled to bus 101 for storing information and instructions to be executed by processor 102. Main memory 104 also may be used for storing temporary variables or other intermediate information during execution of instructions by processor 102. Computer system 100 also comprises a read only memory (ROM) and/or other static storage device 106 coupled to bus 101 for storing static information and instructions for processor 102. Data storage device 107 is coupled to bus 101 for storing information and instructions.

A data storage device 107 such as a magnetic disk or optical disk and its corresponding disk drive can be coupled to computer system 100. Computer system 100 can also be coupled via bus 101 to a display device 121, such as a cathode ray tube (CRT), for displaying information to a computer user. Computer system 100 further includes a keyboard 122 and a cursor control 123, such as a mouse.

The present invention is related to the use of computer system 100 to compressing data. According to one embodiment, compressing data is performed by computer system 100 in response to processor 102 executing sequences of instructions contained in memory 104. Such instructions may be read into memory 104 from another computer-readable medium, such as data storage device 107. Execution of the sequences of instructions contained in memory 104 causes processor 102 to perform the process steps that will be described hereafter. In alternative embodiments, hard-wired circuitry may be used in place of or in combination with software instructions to implement the present invention. Thus, the present invention is not limited to any specific combination of hardware circuitry and software.

Exemplary Bit Streams

Figure 2:
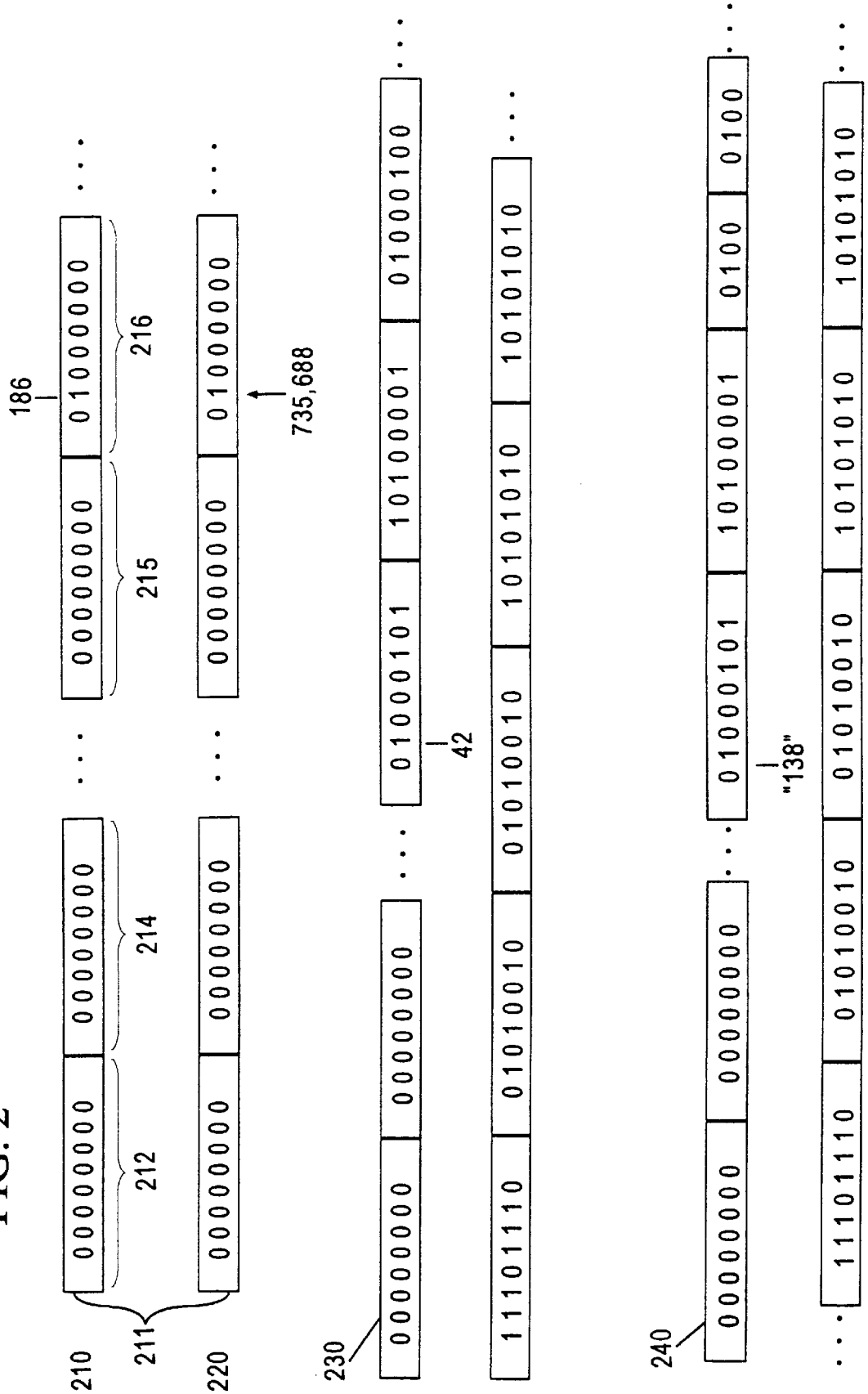
FIG. 2 shows 4 portions of input streams used to demonstrate the compression of an embodiment of the invention.

FIG. 2 illustrates portions of input bit streams 210, 220, 230, and 240. These bit streams are used to describe the compression of an embodiment of the invention. The bit streams are from a bitmap within a bitmap index of a database.

The plurality of bits 211 are shown within their respective bit streams from left to right order. The first bit in bit stream 210 is bit 1 and the bit is set to value zero. All the bit streams of FIG. 2 begin with a bit 1 for purposes of illustration only. The first bit set to value one in bit stream 210 is bit 186. Bit zero and bit 186, like all the other bits in bit stream 210, each represent a row in a database table. The first bit set to the one value in bit stream 220 is bit 735,690 the first bit set to the one value in bit stream 230 is bit 42, and the first bit set to value one in bit stream 240 is bit 130.

It should be apparent that the input bit streams 210, 220, 230, and 240 can represent bit streams from sources other than bitmaps within the bitmap indexes of databases. For instance, bit streams 210, 220, 230, and 240 could represent a portion of a bitmap of pixels for an image, or represent data flow received from a media server.

Division of Stream Into Bytes

Figure 4:
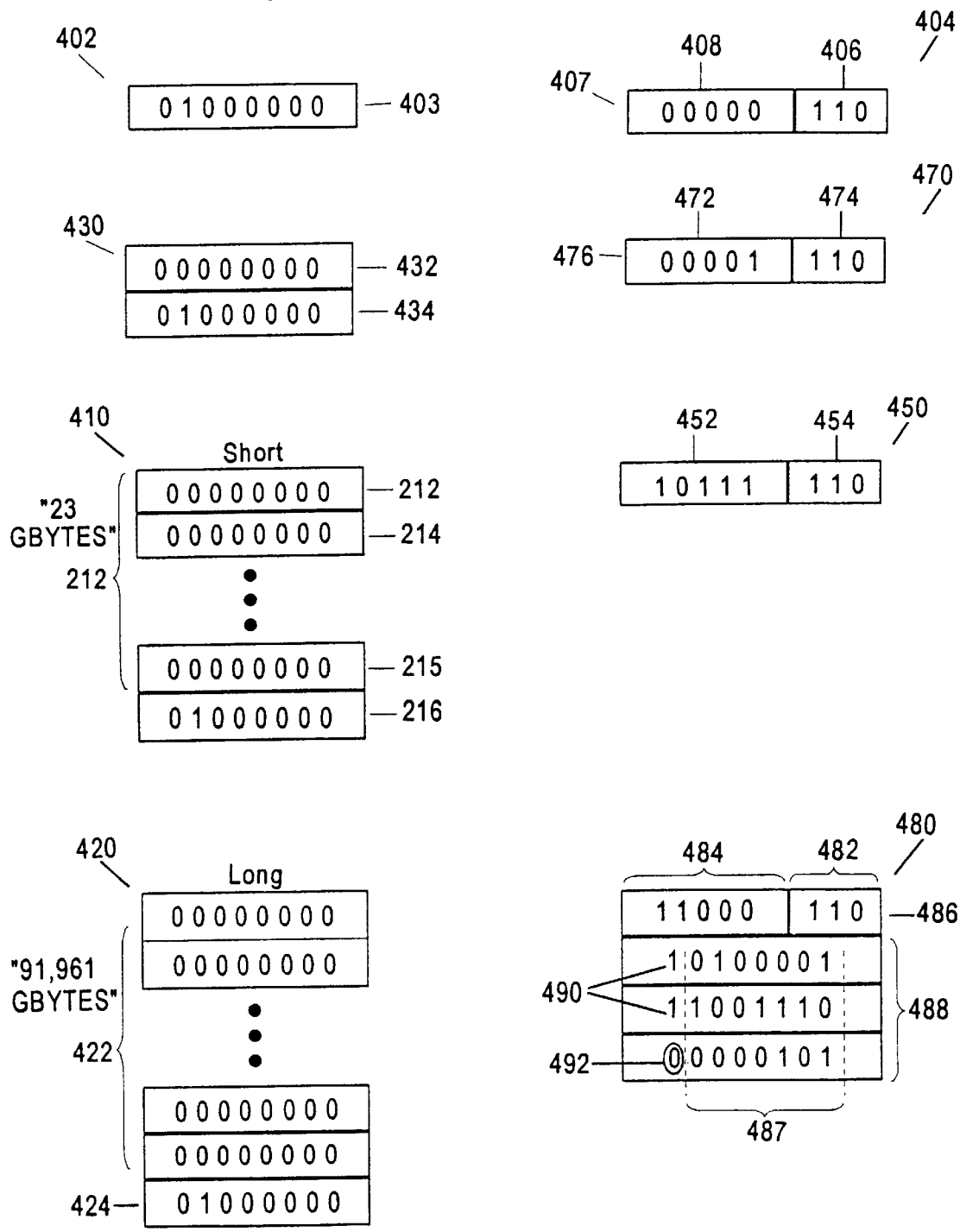
FIG. 4 shows two input streams representing gap bit groups compressed into either a short gap map atom or a long gap map atom.

FIG. 2 shows a portion of bit stream 210. For compatibility with the hardware illustrated in FIG. 1, data in the form of bits from input bit streams like input bit stream 210 are aligned into bit sequences with identical numbers of bits, then stored in computer system 100. A bit sequence is hereinafter called a byte. Bytes 212, 214, 215, and 216 in input stream 210 are examples of bytes. In FIG. 4, the illustrated portion of input bit stream 210 is shown as bit stream 410, which is a bit stream presented in aligned form. Accordingly, bit stream 410 contains bytes 212, 214, 215, and 216.

Figure 5:
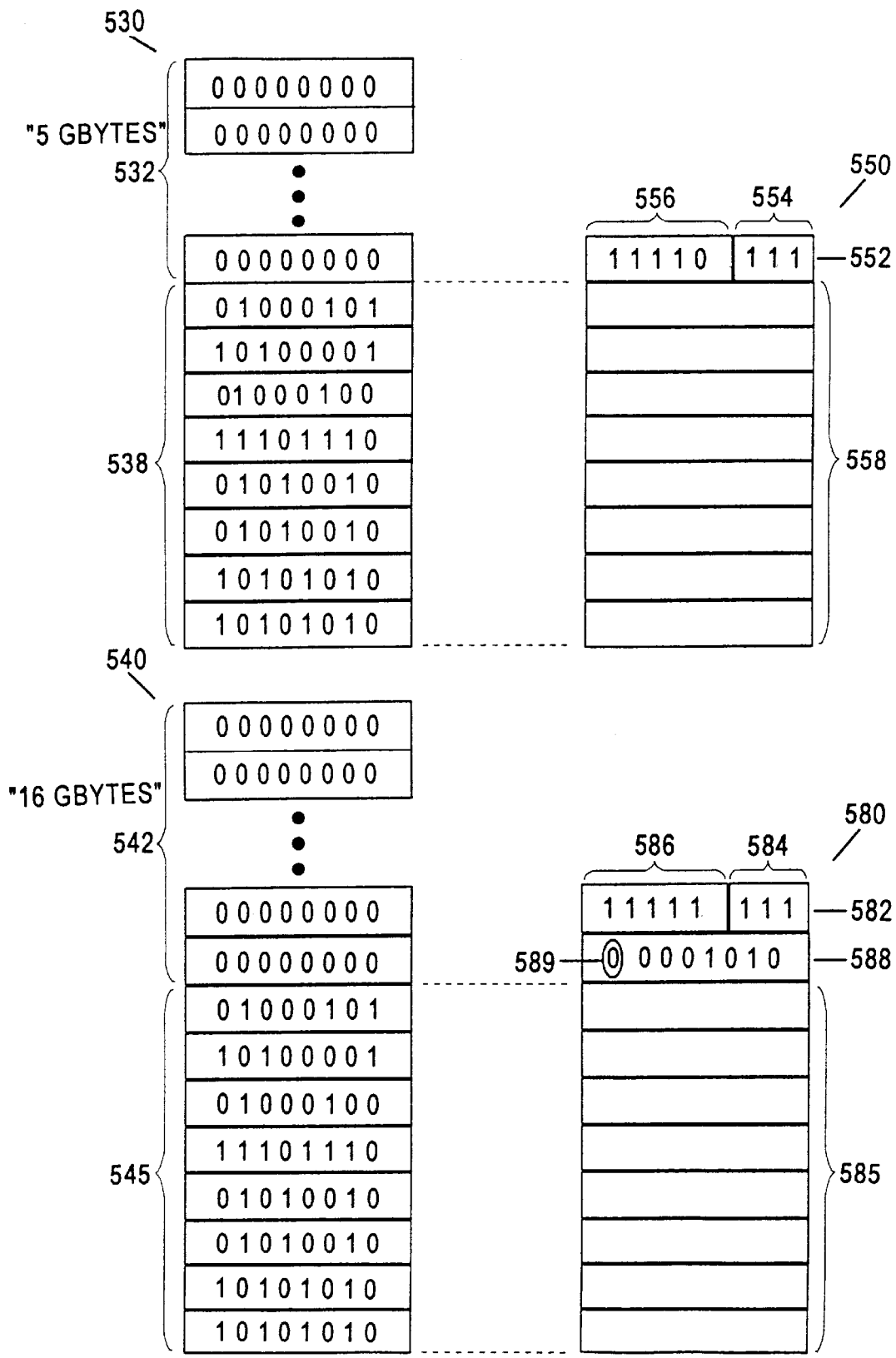
FIG. 5 shows two input stream representing gap map groups compressed into either a short gap map group atom or a long gap map group atom.

The bits from input bit streams 220, 230, and 240 are likewise aligned and stored in computer system 100. FIG. 4 shows the illustrated portion of input bit stream 220 in aligned form as bit stream 420. FIG. 5 shows the illustrated portions of input bit stream 230 and input bit stream 240 in aligned form respectively as bit stream 530 and bit stream 540.

The bytes in all the figures are eight bit bytes. It should be understood that an embodiment of the invention can just as easily be adapted for computer systems having other byte sizes.

Classification of Bytes

In order to achieve the compression, the bytes in bit streams 410, 420, 530, and 540 are first classified. Bytes with all bits set to value zero are classified as a gap byte (GBYTE). Bytes with just one bit set to value one are classified as an offset byte (OBYTE). All other bytes are classified as a map byte (MBYTE).

FIG. 4 shows an example of a GBYTE as byte 212, and an example of an OBYTE is byte 216. FIG. 5 shows an example of an MBYTE as any of the plurality of MBYTEs 538.

Grouping Bytes

Adjacent bytes are organized into groups. There are two types of groups. The type into which a group is placed depends on the types of bytes the group contains. The first type of group is a gap bit group. The gap bit group contains zero or more contiguous GBYTEs followed by one OBYTE. A set of zero or more contiguous GBYTES is called a gap. The number of GBYTEs in a gap is referred to as gap size. The gap size also corresponds to the number of GBYTES in a gap bit group or a gap map group.

FIG. 4 shows bit streams that would be grouped as a gap bit group. Bit stream 410 contains 23 GBYTEs followed by an OBYTE byte 216. Bit stream 420 contains 91,161 GBYTEs followed by an OBYTE 424. The gap size of bit stream 410 and bit stream 420 is 23 and 91,161 respectively.

The second type is a gap map group. This type contains zero or more GBYTEs and zero or more MBYTEs. FIG. 5 shows bit streams that would be placed in a gap map group. Bit stream 530 contains 5 GBYTEs followed by plurality of 8 MBYTEs 538. Bit stream 540 contains 16 GBYTEs followed by plurality of 8 MBYTEs 545.

Generating Compressed Output Stream

Figure 3:
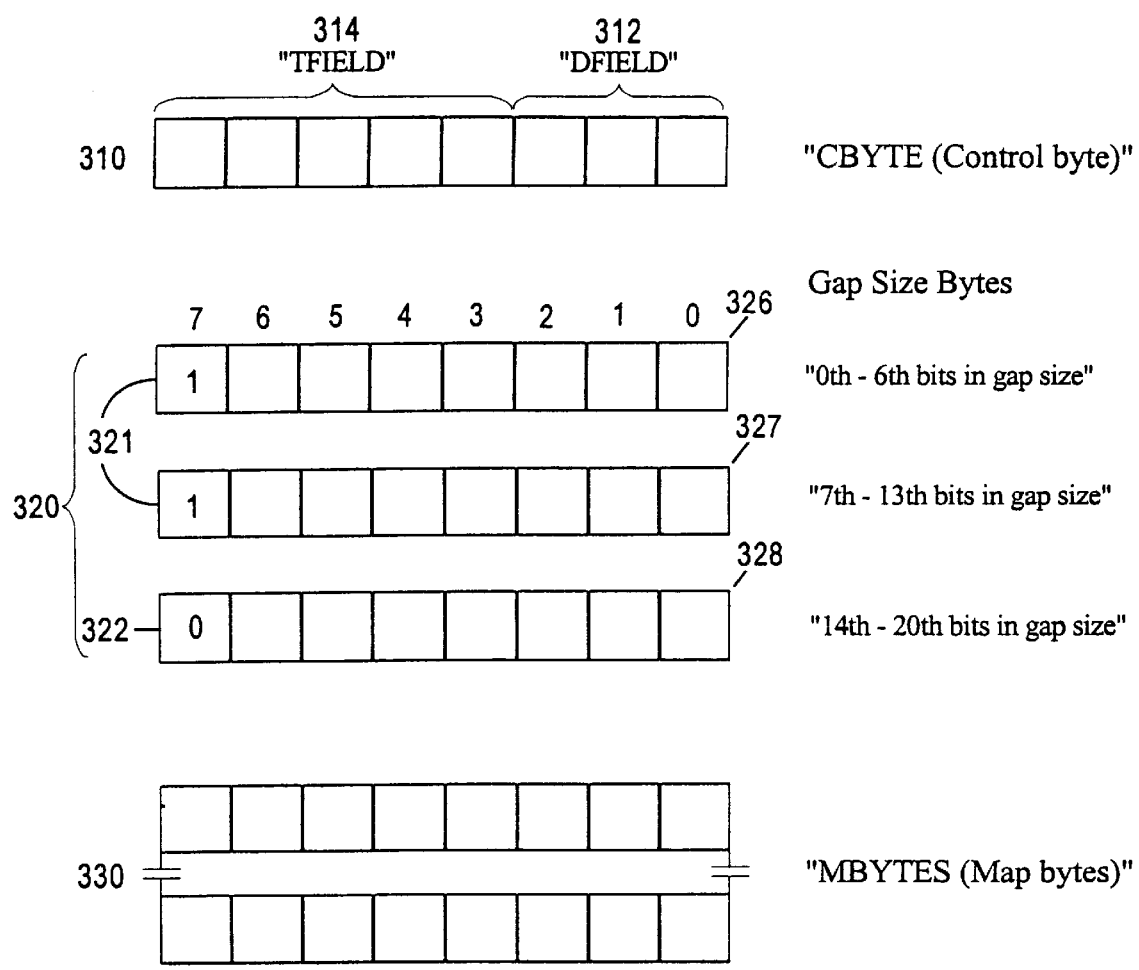
FIG. 3 shows the basic structural element of compressed output referred to as atoms.

The groups represented by bit streams 410, 420, 530, and 540 are compressed into output groups hereinafter referred to as atoms. There are four types of atoms, which are the short gap bit atom, the long gap bit atom, the short gap bit atom, and the long gap map atom. The type to which an atom belongs depends on the type of group being compressed and the gap size of the group. The basic structure of the atom is shown in FIG. 3. Each atom for each group contains one control byte (CBYTE) 310, zero or more gap size bytes 320, and zero or more MBYTEs 330. In FIG. 9, table 900 summarizes details about the atoms which shall be described below.

The CBYTE 310 is composed of two fields used to describe the atom. The two fields are the DFIELD 312 and the TFIELD 314. The DFIELD 312 is a 3 bit sequence used to either describe the OBYTE in the group or the number of MBYTEs in the group. The TFIELD 314 is a 5 bit sequence used to both indicate the type of the atom, and, in conjunction with the gap size bytes 320, to represent the the gap size of the group being compressed. The precise use of the DFIELD 312, TFIELD 314, and gap size bytes 320 shall be explained in further detail.

One advantage of an embodiment of the invention is that a DFIELD and a TFIELD are the same size in every atom type. This uniformity of size enables the computer instructions that cause the computer system 100 to extract the DFIELD and TFIELD from the CBYTE to be implemented in a manner more efficient for computer system 100. This efficiency is especially important because the operation of extracting a DFIELD and TFIELD is highly repeated.

Short Gap Bit Atom

The short gap bit atom is generated to compress a gap bit group when the gap size is 23 or less. The atom is composed of just one byte which is a CBYTE. Representing up to 23 bytes with just one CBYTE is one aspect of an embodiment of the invention that enables it to achieve compression. This aspect is of particular advantage for compressing the bitmaps within the bitmap indexes of databases. The gap sizes of the gaps in these bitmaps are skewed toward the lower numbers like the gap sizes that can be represented by a short gap bit atom.

The bits in the TFIELD are set to values between 0 and 23. When the TFIELD is set to this range, not only does the TFIELD indicate that the atom is a short gap bit atom, but the TFIELD also represents the gap size of the group being compressed. The values 0 to 23, when contained in the TFIELD, represent a gap size of 0 to 23, respectively.

The DFIELD is used to describe the offset bit in the group. The value to which the DFIELD is set indicates which bit is set to value one in the OBYTE.

Using the DFIELD to describe the OBYTE is another aspect of an embodiment of the invention that enables it to achieve compression. In addition to using the CBYTE to encode the GBYTEs, an embodiment of the invention uses the same CBYTE to also encode the OBYTE. This additional use of the control byte is of particular advantage for databases. Distributions of gaps followed by an OBYTE are a commonly found distribution of bits in bitmaps within the bitmap indexes of databases.

In FIG. 4, examples of a short gap bit atoms are shown. Short gap bit atom 404 represents bit stream 402, which is composed one byte, OBYTE 403. Short gap bit atom 404 represents the smallest gap size for a short gap bit atom, gap size 0. Short gap bit atom 404 is composed of one byte, which is CBYTE 407. The TFIELD 408 contains the number 0 in binary form. This number represents that there are 0 GBYTEs in bit stream 402. The DFIELD 406 contains the value 6 in binary form. It represents that the seventh bit in OBYTE 403 is set to value one.

Short gap bit atom 470 represents bit stream 430, which is composed of GBYTE 432 and OBYTE 434. Short gap bit atom 470 represents a gap size of 1. Short gap bit atom 470 is composed of one byte, which is CBYTE 476. The TFIELD 472 contains the number 1 in binary form. This number represents that there is 1 GBYTE in bit stream 430. The DFIELD 474 contains the value 6 in binary form. It represents that the seventh bit in OBYTE byte 434 is set to value one.

Short gap bit atom 450 represents the compressed output of bit stream 410, and represents the largest gap size that can be represented by one control byte for a short gap bit atom. Short gap bit atom 450 is composed of one byte, which is CBYTE 452. The TFIELD 454 contains the number 23 in binary form. This number represents that there are 6 GBYTEs in bit stream 410. The DFIELD 454 contains the value 6 in binary form. It represents that the seventh bit in OBYTE byte 216 is set to value one.

Long Gap Bit Atom

The long gap bit atom is used to compress gap bit groups with gap sizes 24 or greater. The atom is composed of one CBYTE and one or more gap size bytes. The number 24 represents the split. The split is a threshold number that represents the maximum value to which the TFIELD is set for atoms used to compress gap bit groups. The split minus one is the threshold maximum gap size that can be represented by the one byte in the short gap bit atom. Beginning at the split, an embodiment of the invention uses gap size bytes to represent the gap size for gap bit groups.

The left most bit in a gap size bit is used as a flag to indicate whether any more gap size bytes follow. Setting this flag to value one indicates that gap size bytes follow. Setting the flag to value zero indicates that the gap size byte is the last gap size byte. The remainder of the bits on the right in the gap size byte are used to represent a number.

Gap size bytes 320 in FIG. 3 illustrate the use of the gap size bytes. The numbers 0 through 7 in right to left order above gap size byte 326 represent a bit position in each gap size byte of gap size bytes 320. Bits 321 in the leading gap size bytes 326 and 327 are set to value one to indicate a gap size byte follows. Bit 322 in gap size byte 328 is set to value zero to indicate that the gap size byte 328 is the last gap size byte.

The gap size is represented by a binary number formed by the bits in the 0th through 6th positions in gap size bytes 320. The first gap size byte, gap size byte 326, contains the 0th through 6th bits in the binary number representing the gap size. The next gap size byte contains the 7th through 13th bits. The last gap size byte, gap size byte 328, contains the 14th through 20th bits. This pattern of representing the gap size continues for numbers requiring more bits.

Long gap bit atoms have an inherent minimum gap size. The minimum number corresponds to the split. To conserve use of bits, an embodiment of the invention takes advantage of this inherent minimum by storing an offset to the split in the gap size bytes. To determine the gap size of a gap bit group the split is added to the offset. The advantage of using an offset is that it is smaller than the gap size and thus requires less bits to represent. Using less bits within a gap size byte in turn leads to using less gap size bytes, thus further enhancing compression.

FIG. 4 shows an example of a long gap atom. The long gap bit atom 480 represents the compressed output of bit stream 420. Bit stream 420 contains 91,961 GBYTEs 422 and OBYTE 424. The long gap bit atom 480 contains a CBYTE 486 with a DFIELD 482 and a TFIELD 484. The DFIELD 482, set to value 6, represents that the seventh bit is set to value one in OBYTE 424. The TFIELD 484, set to the value 24, represents that the atom is a long gap atom with gap size bytes 488 following CBYTE 486.

The plurality of left bits 490, set to value one, flag that a gap byte size follows. Left bit 492, set to value zero, flags that no gap size byte follows. The plurality of bits 487 represent the offset 91,937. Adding the offset to the split, the number 24, results in the number 91,161.

Long gap bit atom 480 represents, using just 4 bytes, a bit stream 420 composed of 91,962 bytes. Representing with a few bytes a vastly larger number of bytes is one aspect of an embodiment of the invention that enables it to achieve compression.

For smaller numbers, the use of the left most bit as a flag conserves the use of bits in comparison to alternative methods of tracking bytes like gap size bytes. For example, one alternative method of tracking the gap size bytes is to use three bits in the first gap size byte to represent the number of gap size bytes that follow the first gap size byte in a atom.

Figure 7:
FIG. 7 shows a comparison of an alternative method for setting gap size bytes.

FIG. 7 is used to compare an embodiment of the invention to the alternative method and shows two sets of gap size bytes in byte aligned form. Gap size bytes 700 represent the alternative method. Gap size bytes 700 include gap size byte 710 and gap size byte 720. The three bits 712 in gap size byte 710 are used to represent the number of gap size bytes following gap size byte 710. Because there is one gap size byte following gap size byte 710, the three bits 712 are used to represent the number one. The remaining bits in gap size byte 710, which are bits 714, are used to represent the number 127. Because bits 714 contains five bits, two short of the number of bits needed to represent the number 127, the first two bits in gap size byte 720 are also used.

Gap size byte 754 represents an embodiment of the invention. The gap size byte 754 contains the number 127 within bits 756. The bit 758 is a flag indicating that gap size byte 754 is the last gap size byte.

To represent the number 127, the alternative method uses 10 bits while the invention uses 8, for a difference of 2 bits. The alternative method uses all 8 bits of the gap size byte 710 plus 2 bits in gap size byte 720. The invention uses only the 8 bits in gap size byte 754. Furthermore, the alternate method had to use two bytes in order to obtain the number of bits the method needed to represent the number 127.

For lower numbers like 127, an embodiment of the invention conserves bits, bits which can be used for other purposes such as those shown so far. Further more, an embodiment of the invention may conserve the number bytes used to represent lower numbers.

Short Gap Map Atom

The short gap map atom is used to compress gap map groups with 0 to 5 GBYTEs and 1 to 8 MBYTEs. A short gap map atom is composed of a CBYTE and 1 to 8 MBYTEs. The TFIELD ranges in value from 25 to 30. When the TFIELD is set to this range, not only does the TFIELD indicate that the atom is a short gap map atom, but the TFIELD represents the gap size of the group. When the TFIELD contains values 25 through 30, the TFIELD represents a gap size from 0 to 5 respectively. The DFIELD contains a value from 0 to 7 which represents a number of MBYTEs ranging from 1 through 8 respectively. The MBYTEs in the short gap map atom are copies of the MBYTEs in the gap map group the atom represents.

FIG. 5 shows an example of a short gap map atom. Short gap map atom 550 is a compressed representation of bit stream 530. The CBYTE 552 is composed of DFIELD 554 and TFIELD 556. The DFIELD 554 contains the value 7 in binary form which indicates that the gap map atom represents 8 MBYTEs. The TFIELD contains the value 30 which indicates that the atom represents a gap size of 5. The MBYTEs 558 are copies of MBYTEs 538.

CBYTE 552 represents the 5 GBYTEs 532 in bit stream 530. Using one CBYTE to represent all the GBYTEs of short map group is one aspect of this invention that enables it to achieve compression.

Long Gap Map Atom

The long gap map atom is used to compress gap map groups that contain 6 or more GBYTEs. The atom is composed of a CBYTE, 1 or more gap size bytes, and 1 to 8 MBYTEs. The DFIELD in the CBYTE indicates the number of MBYTEs in the long gap map atom in the same manner as the DFIELD in a short gap atom indicates the number of MBYTEs in the short gap atom. The TFIELD in the CBYTE contains the value 31, which denotes that the atom is a long gap map atom with gap size bytes. The gap size bytes are used to indicate the gap size represented by the long gap map atom. These gap size bytes are used in the same manner as the gap size bytes in the long gap bit atom. The only difference is that the number added to the offset is 6. This number is the inherent minimum gap size represented by a long gap map atom.

FIG. 5 shows an example of a long gap map atom. The long gap map atom 580 is a compressed representation of bit stream 540. The CBYTE 582 contains DFIELD 584 and TFIELD 586. The DFIELD is set to the value 7 which denotes that long gap map atom 580 represents 8 MBYTEs. The TFIELD contains value 31 to indicate that gap size bytes are used to indicate the gap size represented by long gap map atom 580. The MBYTEs 585 in long gap map atom 580 are copies of MBYTEs 545 in bit stream 540.

The gap size byte 588 contains left bit 589 which is set to value zero to indicate that no gap size byte follows. The remainder of the bits in gap size byte 588 represent the offset value of 10. Adding the number 6 to the offset results in the gap size represented by long gap map atom 580, which is 16.

CBYTE 582 and gap size byte 588 represent the 16 GBYTEs 542 in bit stream 540. Using the CBYTE 582 and gap size byte 588 to represent all the GBYTEs of a gap map group demonstrates one aspect of this invention that enables it to achieve compression.

Compression of an Input Stream to an Output Stream

Figure 8:
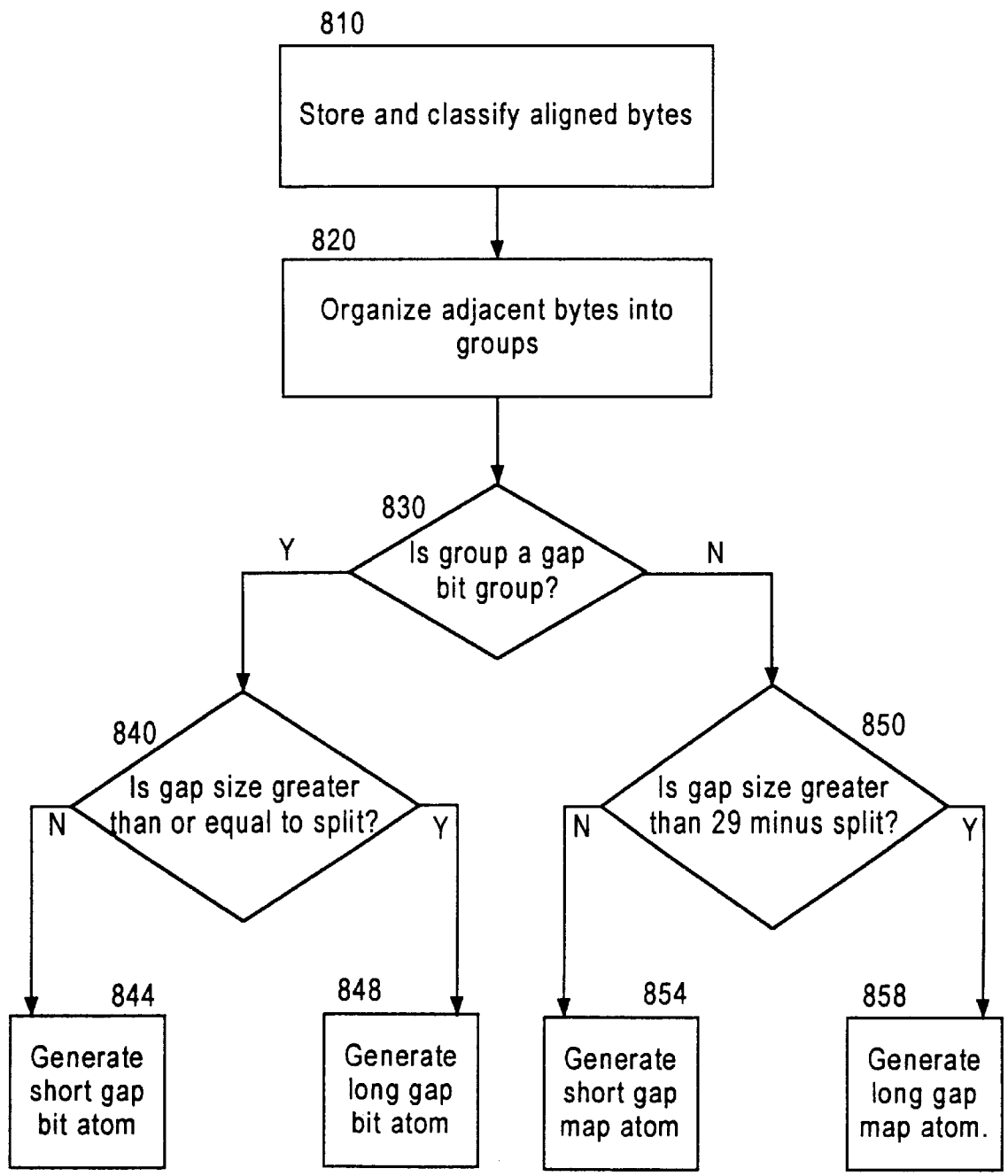
FIG. 8 outlines the steps to compress an input stream into an output stream.

FIG. 8 outlines the steps undertaken to compress an input stream into an output stream. In step 810, bits from an input bit stream are stored as aligned bytes and classified as either CBYTEs, MBYTEs, or OBYTEs. In step 820, adjacent bytes from the input stream are organized into a gap bit group or gap map group. In step 830, a determination is made of whether the group is a gap bit group or is otherwise a gap map group.

If the group is a gap bit group, then the next step is step 840. In step 840, a determination is made of whether the group has a gap size greater than or equal to the threshold represented by the split. If the gap size is less than then the split, then the next step is 844. In step 844, a short gap map atom is generated. If the gap size is greater than or equal to the split, then the next step is 848. In step 848, a long gap bit atom is generated.

If the determination made in step 830 is that the group is a gap map group, then the next step is step 850. In step 850, a determination is made of whether the group has a gap size is greater than the threshold 29 minus the split 24, which is 5. 29 minus the split is the maximum gap size represented by a short gap map atom. If the gap size is less than or equal to this threshold, then the next step is 854. In step 854, a short gap map atom is generated. If the gap size is greater than this threshold, then the next step is 858. In step 858, a long gap bit atom is generated.

Figure 6:
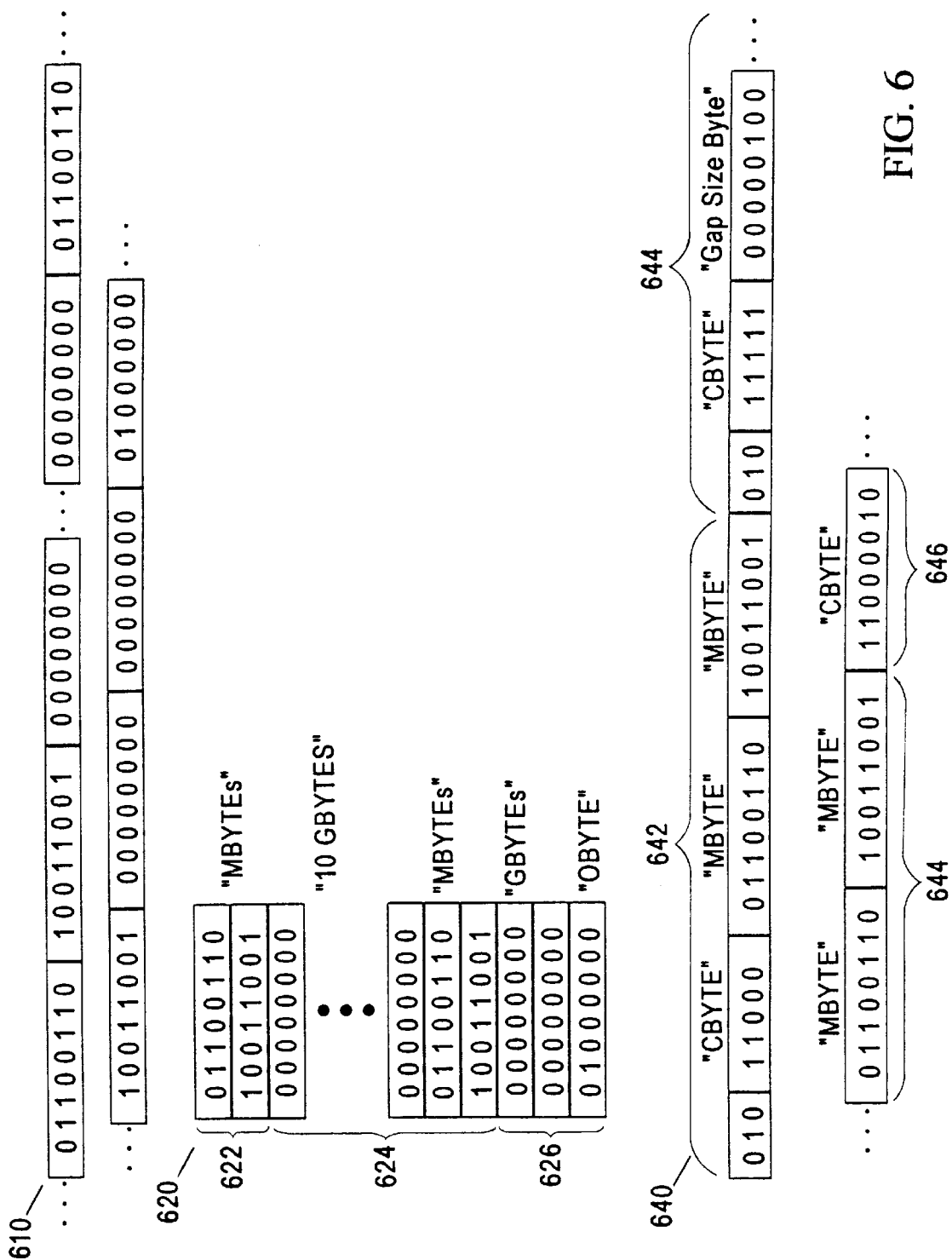
FIG. 6 shows an example of compressing an input bit stream into a output bit stream.

The bit streams shown in FIG. 6 are used as examples of compressing an input bit stream into an output bit stream. FIG. 6 shows exemplary input bit stream 610 and exemplary output bit stream 640. Bit stream 620 is a byte aligned representation of input bit stream 610.

Gap map group 622 is compressed into short gap map atom 642 in output bit stream 640. The gap map group 622 is composed of two MBYTEs. The first byte in short gap map atom 642 is a CBYTE. The first three bits in this CBYTE comprise a DFIELD representing the value 2, which is the number of MBYTEs represented by short gap map atom 642. The remaining bytes in the CBYTE comprise the TFIELD. This TFIELD represents the value 25 which indicates that no GBYTEs follow. The next two bytes in short gap map atom 642 are MBYTES which are copies of the MBYTES in gap map group 622.

The next group to be compressed is the gap map group 624. Gap map group 624 is compressed into long gap map atom 644 in output bit stream 640. Gap map group 624 contains 10 GBYTEs followed by 2 MBYTEs. The first byte in the long gap map atom 644 is a CBYTE. The first three bits in this CBYTE comprise a DFIELD representing the value of 2, which is the number of MBYTEs represented by long gap map atom 644. The remaining bits in the CBYTE are the TFIELD. The TFIELD contains the value 31 to indicate that at least one gap size byte follows the CBYTE.

One gap size byte does follow the CBYTE. The left most bit in the gap size byte is set to value zero to indicate that this byte is the last gap size byte. The gap size byte contains the offset value 4. Adding 6 to the offset results in the number 10, which is the number of gap bytes represented by long gap map atom 644. The last two bytes in long gap map atom 644 are MBYTEs which are copies of the MBYTEs in gap map group 624.

The last group to be compressed is the gap bit group 626. Gap bit group 626 is compressed into short gap bit atom 646. Gap bit group 626 contains two GBYTEs followed by an OBYTE. Short gap bit atom 646 is composed of only one CBYTE. The first three bits are the DFIELD. The DFIELD contains the number 6 to represent that the 7th bit in the OBYTE is set to the value one. The remainder of the bits are the TFIELD. The TFIELD is set to the value 2. This value indicates that the short gap bit atom 646 is a short gap bit atom, and that short gap bit atom 646 represents 2 GBYTEs.

Adjusting the Split

The split is set to 24 to achieve higher compression for the distribution of bits found in the bitmaps within the bitmap indexes of databases. In these kind of bitmaps, the distribution is skewed towards gaps being followed by an OBYTE rather than a MBYTE. In other words, the distribution is skewed towards gap bit groups rather than gap map groups. Short gap bits can represent such gap bit groups with one CBYTE up to gap sizes corresponding to the split minus 1. Increasing the split permits larger gap bit groups to be compressed into short gap bit atoms, thus enhancing compression in bitmaps skewed towards gap bit groups.

If the distribution is skewed toward the other direction in favor of gap map groups, an embodiment of the invention can be adjusted to achieve higher compression for such a distribution. Decreasing the split would permit gap map groups with larger gap sizes to be represented by short gap map atoms, thus enhancing compression in bitmaps skewed toward gap map groups.

The present invention offers advantages over prior approaches for compressing bit streams, especially those from bitmaps within the bitmap indexes of databases. First, an embodiment of the invention is skewed toward efficiently compressing small gap sizes. Because a gap size up to 23 can be represented by one CBYTE, a broader range of small gap sizes can be compressed into one byte. Furthermore, an embodiment of the invention compresses the more common bit distribution of gaps followed by an offset more efficiently than the less common distribution of gaps followed by MBYTES.

The gap size bytes are used efficiently, especially for lower numbers. Only the smaller offset number is stored in the gap size bytes. Using one bit in the gap size byte as a flag enables an embodiment of the invention to represent smaller gap sizes more efficiently.

Finally the size of the TFIELD and DFIELD is uniform for all atom types. This uniformity enables implementing an embodiment of the invention into computer instructions which are more efficient.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method for compressing data in a computer system, the method comprising the steps of:

storing the data into a first set of bit sequences in said computer system, wherein each bit sequence of said first set of bit sequences contains an identical number of bits;

classifying each bit sequence in said first set of bit sequences as a gap bit sequence, an offset bit sequence, or a map bit sequence;

organizing said first set of bit sequences into groups; and generating a compressed output for each group, wherein said compressed output contains a set of zero or more gap size bit sequences, wherein each gap size bit sequence of said set of zero or more gap size bit sequences includes a flag, wherein said flag indicates whether a subsequent gap size bit sequence follows within said compressed output.

2. The method of claim 1, wherein the step of classifying each bit sequence in said first set of bit sequences as a gap bit sequence, a offset bit sequence, or a map bit sequence further includes:

if all bits of said bit sequence are set to logical zero, then classifying said bit sequence as said gap bit sequence, if one bit of said bit sequence is set to logical one, then classifying said bit sequence as said offset bit sequence, and if two or more bits of said bit sequence are set to logical one, then classifying said bit sequence as said map bit sequence.

3. The method of claim 1, wherein the step of generating a compressed output for each group further includes the step of storing a portion of a gap size of said group in said set of zero or more gap size bit sequences.

4. The method of claim 1, wherein the step of generating a compressed output for each group further includes the step of generating a control bit sequence, wherein said control bit sequence indicates:

a number of gap bit sequences in said group, a number of map bit sequences in said group, and if said group contains an offset bit sequence, then which bit is set to value one in said offset bit sequence in said group.

5. The method of claim 1, wherein the method includes the further steps of:

organizing zero or more offset bit sequences together with zero or more gap bit sequences into a gap bit group; and if a gap size of said gap bit group exceeds a first threshold, representing a portion of the said gap size in one or more gap size bit sequences of said set of zero or more gap size bit sequences.

6. The method of claim 1, wherein the method includes the further steps of:

organizing zero or more map bit sequences together with zero or more gap bit sequences into a gap map group; and if a gap size of said gap map group exceeds a second threshold, representing a portion of the said gap size with one or more gap size bit sequences of said set of zero or more gap size bit sequences.

7. A computer readable medium having stored thereon one or more sequences of instructions for compressing data in a computer system, said one or more sequences of instructions which, when executed by a processor, cause said processor to perform the steps of:

storing the data into a first set of bit sequences in said computer system, wherein each bit sequence of said first set of bit sequences contains an identical number of bits;

classifying each bit sequence in said first set of bit sequences as a gap bit sequence, an offset bit sequence, or a map bit sequence;

organizing said first set of bit sequences into groups; and generating a compressed output for each group, wherein said compressed output contains a set of zero or more gap size bit sequences, wherein each gap size bit sequence of said set of zero or more gap size bit sequences includes a flag, wherein said flag indicates whether a subsequent gap size bit sequence follows within said compressed output.

8. The computer-readable medium of claim 7, wherein the step of classifying each bit sequence in said first set of bit sequences as a gap bit sequence, a offset bit sequence, or a map bit sequence further includes:

if all bits of said bit sequence are set to logical zero, then classifying said bit sequence as said gap bit sequence, if one bit of said bit sequence is set to logical one, then classifying said bit sequence as said offset bit sequence, and if two or more bits of said bit sequence are set to logical one, then classifying said bit sequence as said map bit sequence.

9. The computer-readable medium of claim 7, wherein the step of generating a compressed output for each group further includes the step of storing a portion of a gap size of said group in said set of zero or more gap size bit sequences.

10. The computer-readable medium of claim 7, wherein the step of generating a compressed output for each group further includes the step of generating a control bit sequence, wherein said control bit sequence indicates:

a number of gap bit sequences in said group, a number of map bit sequences in said group, and if said group contains an offset bit sequence, then which bit is set to value one in said offset bit sequence in said group.

11. The computer-readable medium of claim 7, wherein the method includes the further steps of:

organizing zero or more offset bit sequences together with zero or more gap bit sequences into a gap bit group; and if a gap size of said gap bit group exceeds a first threshold, representing a portion of the said gap size in one or more gap size bit sequences of said set of zero or more gap size bit sequences.

12. The computer-readable medium of claim 7, wherein the method includes the further steps of:

organizing zero or more map bit sequences together with zero or more gap bit sequences into a gap map group; and if a gap size of said gap map group exceeds a second threshold, representing a portion of the said gap size with one or more gap size bit sequences of said set of zero or more gap size bit sequences.

13. A method for compressing data in a computer system, the method comprising the steps of:

storing the data into a first set of bit sequences in said computer system, wherein each bit sequence of said first set of bit sequence contains an identical number of bits;

classifying each bit sequence in said first set of bit sequences;

organizing said first set of bit sequences into groups; and generating a compressed output for each group, wherein said compressed output contains a set of zero or more gap size bit sequences, wherein said set of zero or more gap size bit sequences represents an offset number, wherein said offset number is less than a gap size of said group.

14. A method for compressing data in a computer system, the method comprising the steps of:

storing the data into a first set of bit sequences in said computer system, wherein each bit sequence of said first set of bit sequence contains an identical number of bits;

classifying each bit sequence in said first set of bit sequences;

organizing said first set of bit sequences into groups;

generating a compressed output for each group, wherein said compressed output contains a control bit sequence describing said group, wherein said control bit sequence contains a field representing a range, wherein said range includes a first subrange and a second subrange;

if said group contains a bit sequence with one bit set to value one, then storing in said field a value within said first subrange, wherein said value represents a gap size of said group; and if said group contains a bit sequence with more than one bit set to value one, then storing in said field a value within said second subrange, wherein said value within said second subrange represents said gap size of said group.

15. The method of claim 14, where said first subrange is greater than said second subrange.

16. A computer readable medium having stored thereon one or more sequences of instructions for compressing data in a computer system, said one or more sequences of instructions which, when executed by a processor, cause said processor to perform the steps of:

storing the data into a first set of bit sequences in said computer system, wherein each bit sequence of said first set of bit sequence contains an identical number of bits;

classifying each bit sequence in said first set of bit sequences;

organizing said first set of bit sequences into groups; and generating a compressed output for each group, wherein said compressed output contains a set of zero or more gap size bit sequences, wherein said set of zero or more gap size bit sequences represents an offset number, wherein said offset number is less than a gap size of said group.

17. A computer readable medium having stored thereon one or more sequences of instructions for compressing data in a computer system, said one or more sequences of instructions which, when executed by a processor, cause said processor to perform the steps of:

storing the data into a first set of bit sequences in said computer system, wherein each bit sequence of said first set of bit sequence contains an identical number of bits;

classifying each bit sequence in said first set of bit sequences;

organizing said first set of bit sequences into groups;

generating a compressed output for each group, wherein said compressed output contains a control bit sequence describing said group, wherein said control bit sequence contains a field representing a range, wherein said range includes a first subrange and a second subrange;

if said group contains a bit sequence with one bit set to value one, then storing in said field a value within said first subrange, wherein said value represents a gap size of said group; and if said group contains a bit sequence with more than one bit set to value one, then storing in said field a value within said second subrange, wherein said value within said second subrange represents said gap size of said group.

18. The computer-readable medium of claim 17, where said first subrange is greater than said second subrange.

* * * * *